(12) United States Patent
Nguyen et al.

(10) Patent No.: US 6,384,637 B1
(45) Date of Patent: May 7, 2002

(54) DIFFERENTIAL AMPLIFIER WITH SELECTABLE HYSTERESIS AND BUFFERED FILTER

(75) Inventors: Huy M. Nguyen; Benedict C. Lau, both of San Jose, CA (US)

(73) Assignee: Rambus, Los Altos, CA (US)

( * ) Notice: Subject to any disclaimer, the term of this patent is extended or adjusted under 35 U.S.C. 154(b) by 0 days.

(21) Appl. No.: 09/588,437

(22) Filed: Jun. 6, 2000

(51) Int. Cl.[7] .............................................. G01R 19/00
(52) U.S. Cl. .............................. 327/54; 327/56; 327/67
(58) Field of Search ............................ 327/51, 52, 54, 327/56, 57, 65, 67, 68, 77, 81, 89, 563; 330/252, 253, 254; 365/207, 208

(56) References Cited

U.S. PATENT DOCUMENTS

| | | | |
|---|---|---|---|
| 4,232,270 A | * 11/1980 | Marmet et al. | 330/253 |
| 4,586,166 A | * 4/1986 | Shah | 365/154 |
| 4,629,911 A | * 12/1986 | Bebernes | 327/85 |
| 4,918,338 A | * 4/1990 | Wong | 327/553 |
| 5,089,789 A | * 2/1992 | Van Tran | 330/253 |
| 5,355,391 A | 10/1994 | Horowitz et al. | 375/257 |
| 5,432,823 A | 7/1995 | Gasbarro et al. | 375/356 |
| 5,442,318 A | * 8/1995 | Badyal | 330/253 |
| 5,526,314 A | * 6/1996 | Kumar | 365/207 |
| 5,530,403 A | * 6/1996 | Bushman et al. | 330/253 |
| 5,608,352 A | * 3/1997 | Itakura | 330/253 |
| 5,614,855 A | 3/1997 | Lee et al. | 327/158 |
| 5,729,159 A | * 3/1998 | Gersbach | 327/52 |
| 5,880,637 A | * 3/1999 | Gonzalez | 330/253 |
| 5,977,798 A | 11/1999 | Zerbe | 326/98 |
| 6,014,042 A | 1/2000 | Nguyen | 327/3 |
| 6,047,346 A | 4/2000 | Lau et al. | 710/126 |

OTHER PUBLICATIONS

Pp. 317–322 of "Analysis and Design of Digital Integrated Circuits, Second Edition," D. Hodges and H. Jackson (1988).

* cited by examiner

*Primary Examiner*—Terry D. Cunningham
*Assistant Examiner*—Paul Dinh
(74) *Attorney, Agent, or Firm*—Arthur J. Behiel

(57) ABSTRACT

A differential amplifier with reduced noise sensitivity enables the bus to operate more efficiently at higher data rates. The amplifier includes an input stage with a pair of adjustable resistive loads that alter the gain of the input stage. A differential output stage receives the output of the input stage and produces a pair of complementary output signals. These output signals are fed back to the adjustable resistive loads so that the gain of the input stage depends upon the levels of the output signals. The feedback is positive, so the voltage transfer characteristic of the inventive amplifier has different input thresholds for positive- and negative-going voltage signals.

15 Claims, 5 Drawing Sheets

DIFFERENTIAL AMPLIFIER WITH SELECTABLE HYSTERESIS AND BUFFERED FILTER

BACKGROUND

Computer components typically communicate via groups of conductors called "buses." Such buses typically connect master devices, such as microprocessors or peripheral controllers, to slave devices, such as memory components or bus transceivers. Master and slave devices are typically connected in parallel to various locations along the bus.

Most common buses are driven by voltage-level signals. However, some modern buses are driven by current-level signals. Such "current-mode" buses offer a number of advantages, including lower signal attenuation and improved speed performance.

FIG. 1 (prior art) is a block diagram of a conventional high-speed, current-driven bus 100. Master device 105 connects to four slave devices 115, 120, 125, and 130 via a transmission line 135. A resistor 140 terminates the end of transmission line 135 opposite master device 105. The value of resistor 140 is matched to the impedance of transmission line 135 to minimize reflections.

Master device 105 is located at one end of transmission line 135. Current driven by master device 105 produces a full-swing signal that propagates along transmission line 135, past each slave device, to be dissipated by resistor 140. In contrast, each slave device sees transmission line 135 as two lines, one extending toward the master device and the other extending toward resistor 140. Each slave device will therefore produce a drive current that is divided between the two "branches" of transmission line 135, generating a first half-swing signal toward master device 105 and a second half-swing signal toward resistor 140.

Master device 105 has high input impedance, and therefore reflects half-swing signals propagated from the slave devices. Each reflected signal combines with the half-swing signal that initiated the reflection, with the resulting sum producing a full-swing signal at the input of the master device. The master device thus senses a full-swing signal despite the fact that the slaves only drive half-swing signals. Preferably, master device 105 connects to transmission line 135 in a region at or very near the point of reflection. Signal width and propagation delay dictate the extent of this region.

FIG. 2 (prior art) depicts another view of bus 100 in which slave devices 125 and 130 are omitted for brevity. Slave devices 115 and 120 are shown to include respective NMOS transistors 200 and 205, each connected between transmission line 135 and ground potential.

In this example, slaves 115 and 120 express logic zeros by allowing transmission line 135 to transition to a relatively high voltage, pulling line 135 toward $V_T$ via resistor 140, which as a value $R_T$. Slaves 115 and 120 express logic-one signals on transmission line 135 by pulling the voltage level on transmission line 135 toward ground with a current $I_T$. Hence, either of slaves 115 or 120 can produce a voltage swing of $I_T R_T$, so that the low output voltage $V_{OL}$ used to express a logic one on transmission line 135 is $V_T - I_T R_T$.

When master 105 successively reads logic ones (successive low voltages) from each of slaves 115 and 120:

1. transistor 200 turns on, pulling transmission line 135 toward ground potential;
2. transistor 200 turns off, allowing resistor 140 to pull transmission line 135 toward $V_T$; and
3. transistor 205 turns on, once again pulling transmission line 135 toward ground potential.

The time between transistor 200 turning off and transistor 205 turning on can be very short, particularly if slaves 115 and 120 are relatively near one another on bus 100 and bus 100 is operated at high speed.

MOS transistors 200 and 205, under the right conditions, operate as fairly good current sources. That is to say, they provide a relatively constant current over a range of output voltages. However, when the drain-to-source voltage across transistors 200 and 205 is too low, transistors 200 and 205 no longer approximate current sources, and the resulting current fluctuations can introduce undesirable noise on line 135. This problem is explained below in connection with FIGS. 3 and 4.

FIG. 3 is a graph 300 illustrating the relationship between drain current $I_{DS1}$ and drain-to-source voltage $V_{DS1}$ for transistor 200 of FIG. 2. As can be seen in graph 300, the drain current $I_{DS1}$—the output current of slave device 115— is relatively constant with variations in drain-to-source voltage $V_{DS1}$ if drain-source voltage $V_{DS1}$ is kept above a minimum level 305. Thus, as long as the lower operation voltage $V_{OL}$ of transmission line 135 is high enough, NMOS transistors such as transistors 200 and 205 will work well as current sources.

Unfortunately, the lower the value of $V_{OL}$, the higher the power dissipated when one of the slave devices drives a low voltage on transmission line 135. It is therefore desirable to limit $V_{OL}$ to a level that minimizes power dissipation without affecting the ability of the slave devices to deliver clean signals with minimal reflection. In the example of FIG. 3, the drain-source voltage $V_{DS1}$ is maintained in a range 310 that maintains a relatively constant drain-to-source current $I_{DS1}$ while maintaining a low $V_{OL}$ of transmission line 135.

In an exemplary bus designed by Rambus Inc. of Mountain View, California, signals on transmission line 135 range between a high $V_{OH}$ of approximately 1.8 volts and a low $V_{OL}$ of approximately 1.0 volt. Each slave, through its respective drive transistor, sinks about 28 milliamps with a channel impedance of 28 ohms to produce a bus swing of about 800 millivolts. These low voltages and currents allow this bus to operate at extraordinary speeds while dissipating relatively little power. Nevertheless, there is always a demand for improved speed performance and reduced power consumption, and thus for faster, more efficient data buses.

For additional details about the problems of transmitting data over high-speed bus systems like the one described above, see U.S. Pat. No. 5,355,391 to Horowitz et al., issued Oct. 11, 1994, which is incorporated herein by reference.

SUMMARY

The present invention is directed to a differential amplifier with reduced noise sensitivity. When the amplifier is used as a receiver on a data bus, the amplifier's reduced noise sensitivity enables the bus to operate more efficiently and at higher data rates.

A differential amplifier in accordance with the invention includes differential input and output stages. The differential input stage has a pair of adjustable resistive loads that actively alter the gain of the input stage. The differential output stage receives the output of the input stage and produces a pair of complementary output signals. These output signals are fed back to the adjustable resistive loads so that the gain of the input stage depends upon the levels of the output signals. The feedback is positive, so the voltage transfer characteristic of the inventive amplifier has different input thresholds for positive-and negative-going voltage signals. The amplifier is optimized so that the different threshold voltages mask troublesome noise sources, allowing the bus to operate at higher data rates.

3

This summary does not limit the invention, which is instead defined by the appended claims.

DETAILED DESCRIPTION

Figure 1:
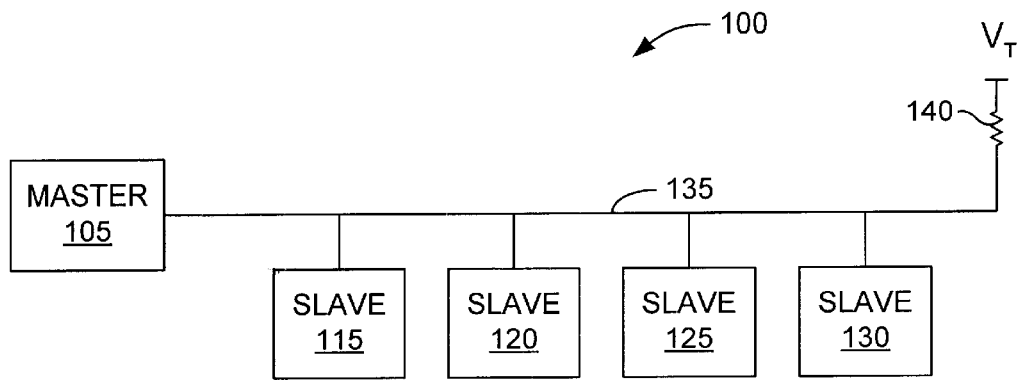
FIG. 1 (prior art) is a block diagram of a conventional high-speed current-driven bus 100.
Figure 2:
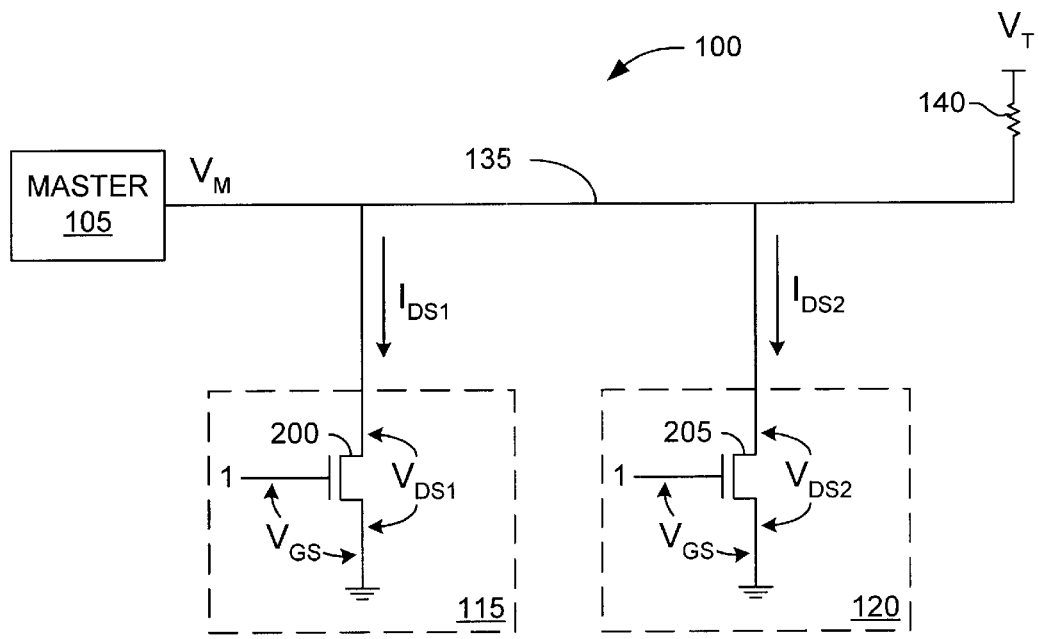
FIG. 2 (prior art) depicts another view of bus 100.
Figure 4:
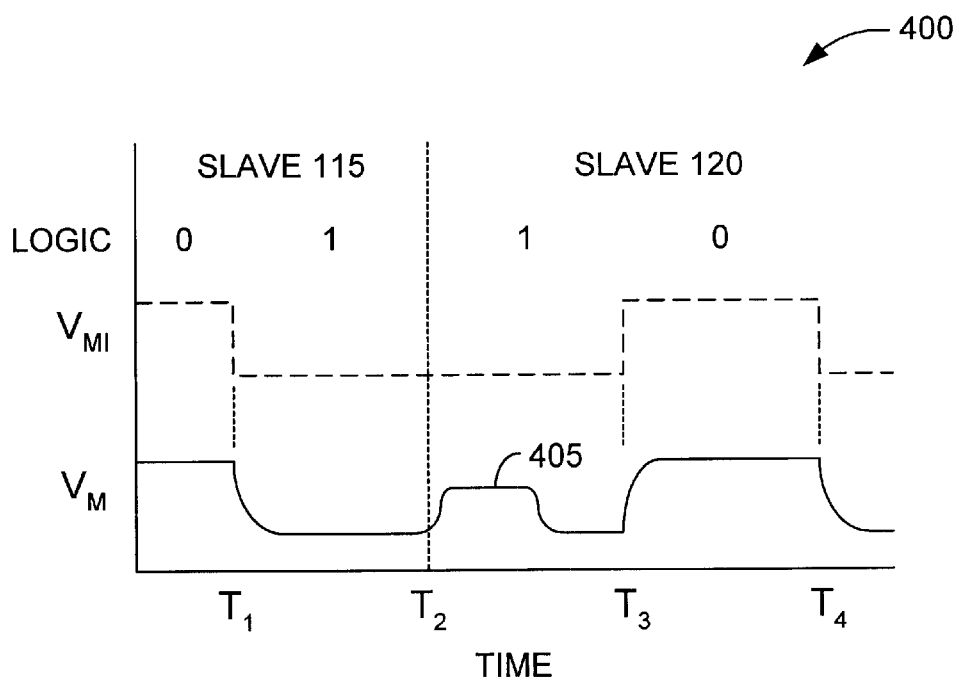
FIG. 4 is a waveform diagram 400 depicting a specific type of signal distortion that can limit the performance of conventional bus 100 of FIGS. 1 and 2.

FIG. 4 is a waveform diagram 400 depicting a specific type of signal distortion that can limit the performance of conventional bus 100 of FIGS. 1 and 2. This type of distortion can occur when slave devices on bus 100 successively output low voltage levels on transmission line 135. Commonly, the two slave devices are memories, and the successive voltage levels are data obtained during "back-to-back reads" from adjacent memories.

Diagram 400 depicts a pair of waveforms $V_{MI}$ and $V_M$. Waveform $V_{MI}$ is the ideal expression of the voltage levels on the input terminal of master device 105 in the event that slave device 115 outputs a zero-one logic pattern on transmission line 135 and slave device 120 quickly follows with a one-zero logic pattern. Logic ones are expressed on bus 100 as relatively low voltage levels, whereas logic ones are expressed as relatively high voltage levels. Other buses use the opposite convention.

Waveform $V_M$ is a non-ideal version of waveform $V_{MI}$, and illustrates a noise problem that can be encountered on the input terminal of master device 105 in the event that slave devices 115 and 120 each output a low level in rapid succession on transmission line 135. This data pattern represents a "back-to-back" read of logic ones from devices 115 and 120.

Figure 3:
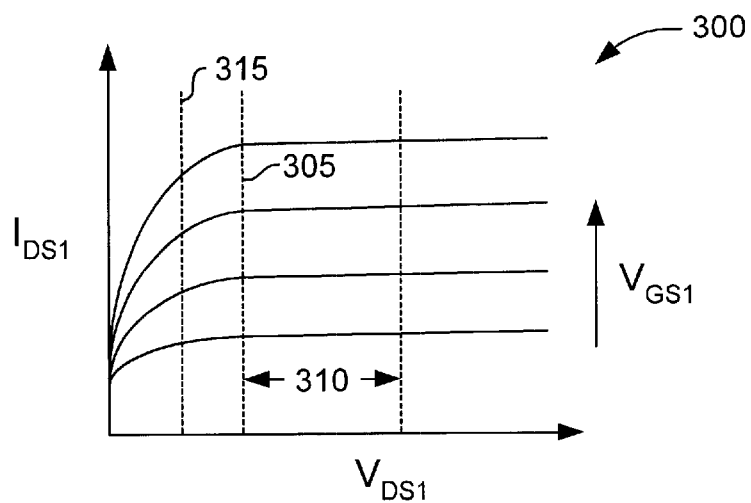
FIG. 3 is a graph 300 illustrating the relationship between drain current $I_{DS1}$ and drain-to-source voltage $V_{DS1}$ for transistor 200 of FIG. 2.

Each signal provided on line 135 by a slave device reflects off the high input impedance of master device 105. If bus 100 is operating at very high speed, as is desirable, then the reflected logic one voltage level (a relatively low voltage) from slave device 115 may be in the vicinity of slave device 120 at time $T_2$. Thus, the drain-to-source voltage $V_{DS2}$ of slave device 120 may be insufficient to enable transistor 205 to sink the full 28 milliamps normally used to express a logic one. Referring to FIG. 3, the residual reflection from reading slave device 115 causes transistor 205 to operate at a level 315 at which drain current $I_{DS2}$ is reduced. This reduction means that the signal from slave device 120 has less than optimal power; consequently, the voltage $V_M$ at the input of master device 105 may not be low enough to express a logic

4 one. This period of distortion is shown in FIG. 4 as a plateau 405, though the depicted waveform shape is only illustrative.

Figure 5A:
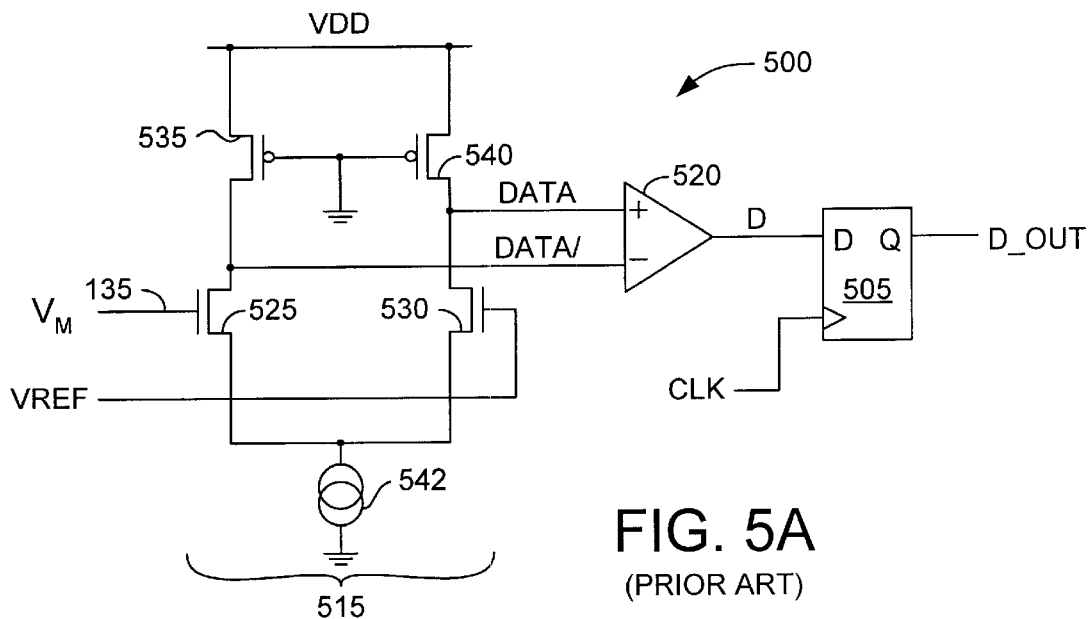
FIG. 5A is a schematic diagram of a conventional differential amplifier 500 connected to a conventional D flip-flop 505.

FIG. 5A is a schematic diagram of a conventional differential amplifier 500 connected to a conventional D flip-flop 505. Differential amplifier 500 includes an input stage 515 and an output stage 520. Input stage 515 includes a pair of differential input transistors 525 and 530, the control terminals of which are connected to bus 135 (FIG. 1) and a reference voltage VREF, respectively. Input stage 515 also includes a pair of load transistors 535 and 540 and a current source 542. The output terminals DATA and DATA/of input stage 515 connect to respective differential input terminals of output stage 520. Flip-flop 505 synchronizes the output D of output stage 520 with a clock signal CLK to produce a synchronous output signal D_OUT.

Figure 5B:
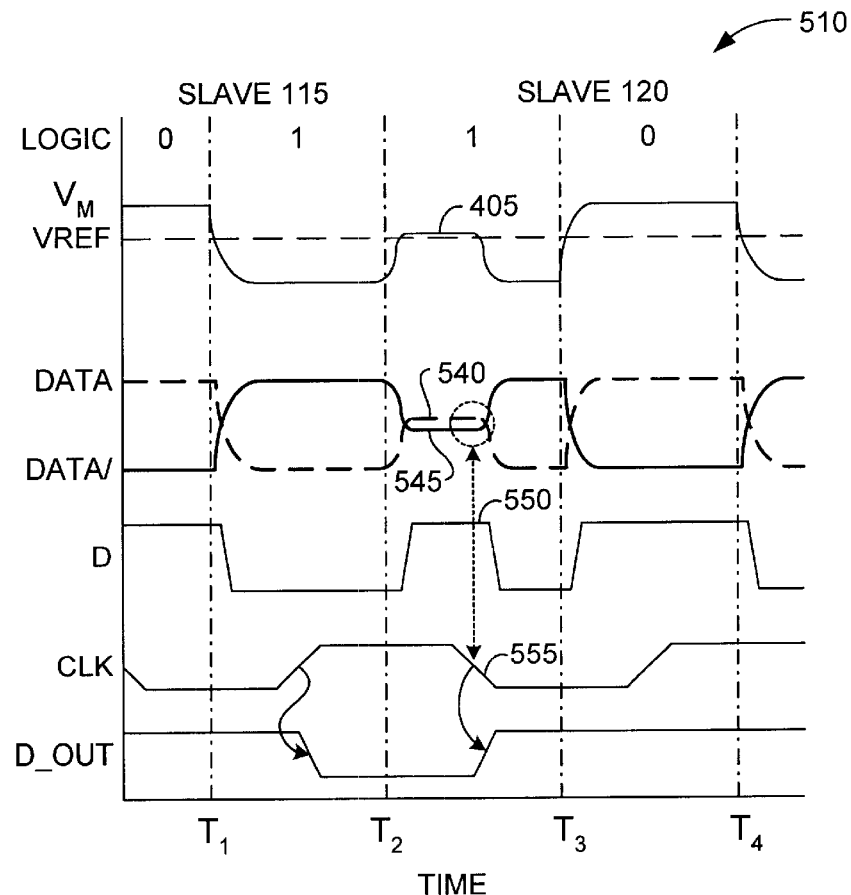
FIG. 5B is a waveform diagram 510 depicting the operation of amplifier 500 and flip-flop 505 of FIG. 5A.

FIG. 5B is a waveform diagram 510 depicting the operation of amplifier 500 and flip-flop 505 of FIG. 5A. FIGS. 5A and 5B together illustrate the potential problems caused by the distortion illustrated as input voltage $V_M$—including plateau 405—in FIG. 4. Input signal $V_M$ is reproduced in FIG. 5B.

Input stage 515 amplifies the difference between signals $V_M$ and $V_{REF}$, producing a pair of complementary output signals DATA and DATA/on the like-named output terminals of input stage 515. Plateau 405 of signal $V_M$ introduces similar distortions 540 and 545 in each of signals DATA and DATA/. Output stage 520 amplifies the difference between signals DATA and DATA/and produces an output signal D. If distortions 540 and 545 overlap as shown, then output signal D will express an incorrect logic level (distortion 550) during the period of overlap. Finally, if distortion 550 overlaps a clock edge 555, then the incorrect logic level expressed in waveform D is latched into flip-flop 505, resulting in an erroneous output signal D_OUT. In the example, the input stream "0110" produces an output stream of "0100" due to the distorted representation of the second "1" on signal $V_M$.

The above-illustrated problem occurs when bus 135 operates at relatively high speed. However, high clock frequencies are desirable, as they allow data to be transferred at higher rates. It is therefore desirable to solve the distortion problem without resorting to reduced clock frequencies.

Figure 6A:
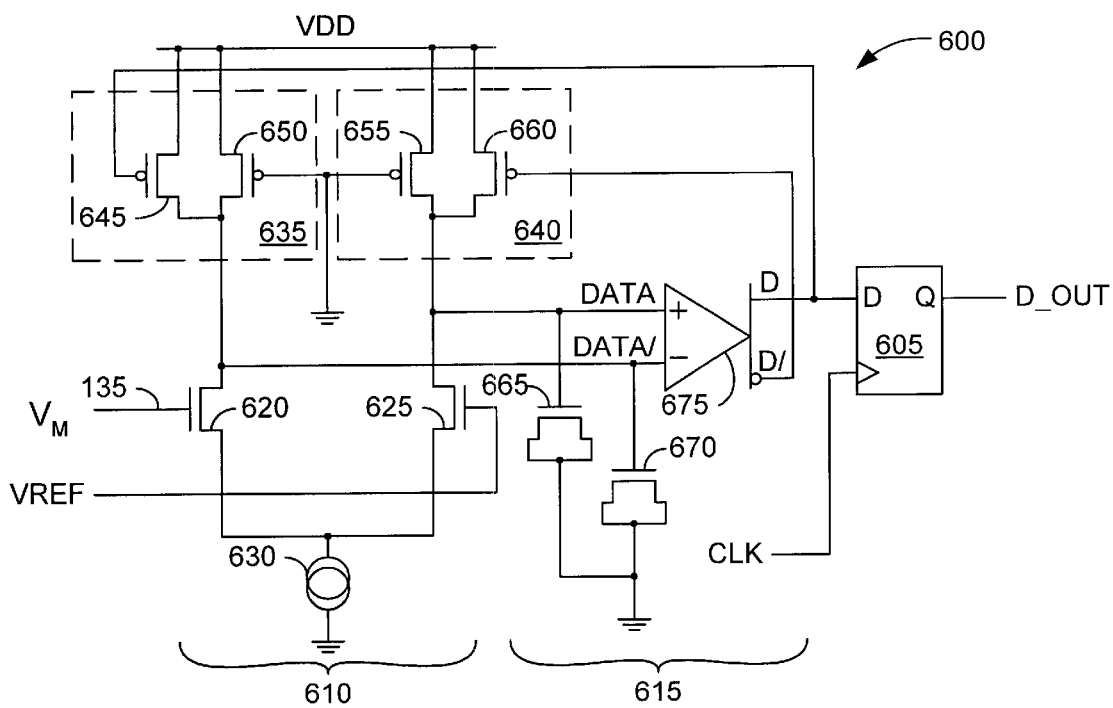
FIG. 6A schematically depicts a differential amplifier 600 connected to a conventional flip-flop 605.

FIG. 6A schematically depicts a differential amplifier 600 connected to a conventional flip-flop 605. Amplifier 600 is adapted in accordance with the invention to address the distortion problem described above in connection with FIGS. 5A and 5B.

Differential amplifier 600 includes an input stage 610 and an output stage 615. Input stage 610 includes a pair of differential input transistors 620 and 625, the control terminals of which are connected to bus 135 (FIG. 1) via a terminal $V_M$ and to a reference voltage V. Input stage 610 also includes a conventional current sink 630 and a pair of active loads 635 and 640. Active load 635 includes a pair of PMOS transistors 645 and 650, and active load 640 includes a pair of PMOS transistors 655 and 660. Current sink 630 typically includes a transistor (not shown) operating in or near saturation.

Output stage 615 includes a pair of transistors 665 and 670 and a differential amplifier 675. Amplifier 675 has a pair of differential input terminals connected to the DATA and DATA/output terminals of input stage 610. Output stage 615 additionally includes a pair of differential output terminals D and D/connected to the control terminals of transistors 645 and 660, respectively. Flip-flop 605 synchronizes output signal D with a clock signal CLK to produce synchronized output signal D_OUT.

Figure 6B:
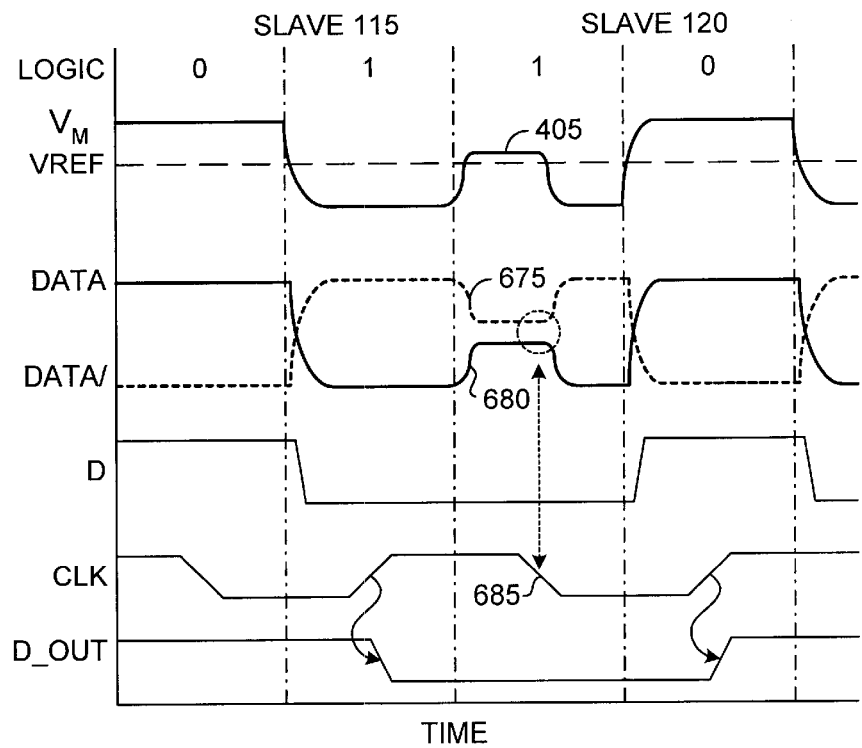
FIG. 6B is a waveform diagram depicting the operation of amplifier 600 and flip-flop 605 of FIG. 6A.

FIG. 6B is a waveform diagram depicting the operation of amplifier 600 and flip-flop 605 of FIG. 6A in response to distorted waveform $V_M$ of FIG. 4. Output signals D and D/from output stage 615 alter the respective conductivities of transistors 645 and 660, and consequently alter the gain of each leg of input stage 610. For example, when output signals D and D/are high and low, respectively, transistor 645 is turned off and transistor 660 turned on. Thus, the resistance through active load 635 is increased relative to the resistance through active load 640. When, on the other hand, output signals D and D/are low and high, respectively, the resistance through active load 635 is reduced relative to the resistance through active load 640. Consequently, the gain through input stage 610 for input signal $V_M$ is lower when output signal D is low than it is when output signal D is high.

Using former output values to change the way a system responds to input signals—a technique commonly referred to as "hysteresis"—is not new. A well-known circuit called a "Schmitt Trigger" employs hysteresis to advantage in single-ended circuits. For a detailed discussion of Schmitt Triggers, see "Analysis and Design of Digital Integrated Circuits, Second Edition," by D. Hodges and H. Jackson, pages 317–322 (1988), which is incorporated herein by reference.

Input stage 610 amplifies the difference between signals $V_M$ and $V_{REF}$, producing a pair of complementary output signals DATA and DATA/on like-named output terminals of input stage 610. As with input stage 515 of FIG. 5A, plateau 405 of signal $V_M$ introduces similar distortions 675 and 680 in each of signals DATA and DATA/. However, the reduced gain of input stage 610 when output signal D is low reduces the amplitude of distortions 675 and 680 relative to their counterparts 540 and 545 (FIG. 5B). The amplitudes of distortions 675 and 680 are sufficiently reduced so that they do not overlap at clock edge 685. Consequently, output signal D expresses the correct logic level for the duration of distortions 675 and 680. Thus, the correct logic level expressed in waveform D is latched into flip-flop 605. In the example, the input logic "0110" produces the correct output stream of "0110" despite the distorted representation of the second "1" on signal $V_M$.

The loads on terminals DATA and DATA/, the junction capacitances of transistors 645 and 660 for example, inherently provide a degree of filtering. Transistors 645 and 660 can be sized to provide desired filtering effects, with or without changing the amount of hysteresis feedback. Alternatively, capacitors 665 and 670 can be included and sized, as necessary, depending upon the noise profile of amplifier 600 and flip-flop 605. Selecting appropriate capacitance values for a particular application is within the skill of those familiar with amplifier design.

Figure 7:
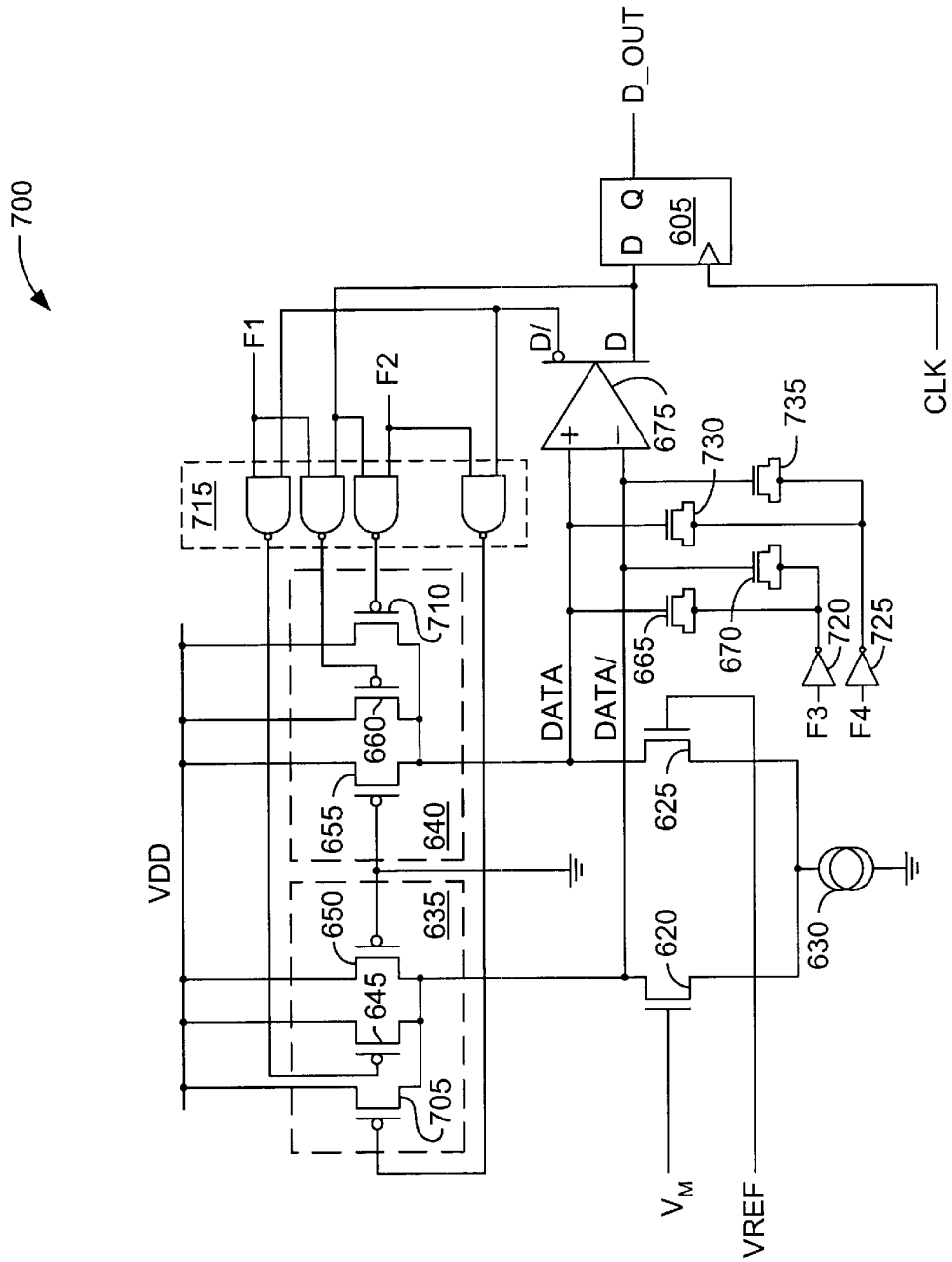
FIG. 7 schematically depicts a differential amplifier 700 in accordance with an embodiment of the invention.

FIG. 7 schematically depicts a differential amplifier 700 in accordance with another embodiment of the invention. Amplifier 700 is similar to amplifier 600 of FIG. 6, like-numbered elements being the same. Amplifier 700 also includes configurable filter circuits for adjusting the hysteresis feedback and filter properties of amplifier 700.

In accordance with the embodiment of FIG. 7, active loads 635 and 640 are modified to include additional transistors 705 and 710. Amplifier 700 additionally includes a feedback-control circuit 715, a pair of inverters 720 and 725, and an additional pair of capacitor-connected transistors 730 and 735. Feedback-control circuit 715 includes a sequence of conventional NAND gates.

Control circuit 715 connects to a pair of filter control terminals F1 and F2. The logic levels presented on control terminals F1 and F2 determined which, if any, of transistors 705, 645, 660, and 710 participate in determining the resistance through active loads 635 and 640. For example, if terminal F1 receives a logic zero, then transistors 645 and 660 remain turned off regardless of the voltage level on terminal D/. A circuit designer can adjust active loads 635 and 640 by providing different combinations of logic levels on terminals F1 and F2. Additional gates can be provided within sequence 715 along with additional corresponding transistors within active loads 635 and 640, depending on the desired amount of adjustment granularity.

An additional pair of filter control terminals F3 and F4 enables circuit designers to adjust the effects of capacitor-connected transistors 665, 670, 730, and 735. Control terminals F3 and F4 and the associated capacitors allow the circuit designer to adjust the filtering associated with amplifier 700 without altering the hysteresis feedback provided through active loads 635 and 640. Additional capacitors and associated filter control lines can be added as necessary to provide better control over the level of filtering on terminals DATA and DATA/.

Each filtering element of amplifier 700 is isolated from input terminal $V_M$, and is therefore isolated from the data bus. Transmission line 135 (FIGS. 1 and 2) is therefore shielded from the capacitive loading effects of the filter elements.

When differential amplifiers 600 or 700 (FIGS. 6 and 7) operate at low source voltages, the gain of the amplifiers may be different for high and low input data swings. Loads 635 and 640 may be designed with unequal resistances that compensate for this gain inequality. For a detailed discussion of this problem and a solution that can be adapted for use with the present invention, see the copending U.S. patent application entitled "Differential Amplifiers with Current and Resistance Compensation Elements for Balanced Output," by H. Nguyen, B. Lau, and R. Vu, filed May 15, 2000, application Ser. No. 09/571,089 (Docket No. RA184), which is incorporated herein by reference.

While the present invention has been described in connection with specific embodiments, variations of these embodiments will be obvious to those of ordinary skill in the art. Therefore, the spirit and scope of the appended claims should not be limited to the foregoing description.

We claim:

1. A differential amplifier comprising:
   a. a power-supply terminal;
   b. a first load having a first load terminal connected to the power-supply terminal, a second load terminal, and a first-load control terminal;
   c. a second load having a third load terminal connected to the power-supply terminal and a fourth load terminal;
   d. a first input transistor having:
      i. a control terminal connected to a first differential input terminal;
      ii. a first current-handling terminal connected to a current sink; and
      iii. a second current-handling terminal connected to the second load terminal; and
   e. a second input transistor having:
      i. a control terminal connected to a second differential input terminal;
      ii. a first current-handling terminal connected to the current sink; and
      iii. a second current-handling terminal connected to the fourth load terminal;

f. wherein the second current-handling terminal of the first input transistor connects to the first-load control terminal through a configurable logic circuit, the configurable logic circuit including a filter control terminal adapted to selectively disconnect the second current-handling terminal of the first input transistor from the first-load control terminal in response to a filter control signal.

2. The amplifier of claim 1, wherein at least one of the first and second differential input terminals is connected to a voltage reference.

3. The amplifier of claim 1, wherein the first and second input transistors are field-effect transistors.

4. A differential amplifier comprising:
 a. a power-supply terminal;
 b. a first load having a first load terminal connected to the power-supply terminal, a second load terminal, and a first-load control terminal;
 c. a second load having a third load terminal connected to the power-supply terminal and a fourth load terminal;
 d. a first input transistor having:
  i. a control terminal connected to a first differential input terminal;
  ii. a first current-handling terminal connected to a current sink; and
  iii. a second current-handling terminal connected to the second load terminal; and
 e. a second input transistor having:
  i. a control terminal connected to a second differential input terminal;
  ii. a first current-handling terminal connected to the current sink; and
  iii. a second current-handling terminal connected to the fourth load terminal; and
 f. a second differential amplifier having a first differential-amplifier input terminal connected to the second current-handling terminal of the first input transistor, a second differential-amplifier input terminal connected to the second current-handling terminal of the second input transistor, and an output terminal connected to the first-load control terminal.

5. The amplifier of claim 4, wherein the second load includes a second-load control terminal connected to the second current-handling terminal of the second input transistor via the second differential amplifier.

6. The amplifier of claim 4, wherein the second load includes a second-load control terminal, and wherein the second differential amplifier further includes a second output terminal connected to teh second-load control terminal.

7. A differential amplifier comprising:
 a. a power-supply terminal;
 b. a first load having a first load terminal connected to the power-supply terminal, a second load terminal, and a first-load control terminal;
 c. a second load having a third load terminal connected to the power-supply terminal and a fourth load terminal;
 d. a first input transistor having:
  i. a control terminal connected to a first differential input terminal;
  ii. a first current-handling terminal connected to a current sink; and
  iii. a second current-handling terminal connected to the second load terminal;
 e. a second input transistor having:
  i. a control terminal connected to a second differential input terminal;
  ii. a first current-handling terminal connected to the current sink; and
  iii. a second current-handling terminal connected to the fourth load terminal and the first-load control terminal; and
 f. a capacitor connected between a voltage reference and the second current-handling terminal of the first input transistor.

8. The amplifier of claim 7, wherein the voltage reference is configurable.

9. The amplifier of claim 7, further comprising a capacitor connected between a second voltage reference and the second current-handling terminal of the second input transistor.

10. The amplifier of claim 9, wherein the second voltage reference is configurable.

11. A circuit comprising:
 a. a power-supply terminal;
 b. an adjustable load having a first load terminal connected to the power-supply terminal, a second load terminal, and an adjustable-load control terminal;
 c. a second load having a second-load control terminal, a third load terminal connected to the power-supply terminal, and a fourth load terminal; and
 d. a differential amplifier having:
  i. a first differential input terminal connected to the second load terminal;
  ii. a second differential input terminal connected to the fourth load terminal;
  iii. a first differential output terminal connected to the adjustable-load control terminal and adapted to produce an output signal having an output-signal level;
  iv. a second differential output terminal adapted to produce a second output signal complementary to the first-mentioned output signal; and
  v. a configurable feedback circuit having at least one filter control terminal adapted to receive a filter control signal, wherein the resistance through the adjustable load is determined, at least in part, by the configurable feedback circuit;
 e. wherein the adjustable load exhibits a variable load resistance that varies with changes in the output-signal level.

12. The circuit of claim 11, wherein the adjustable load comprises a transistor.

13. The circuit of claim 11, further comprising a flip-flop having an input terminal connected to the output terminal.

14. A differential amplifier comprising:
 a. a differential input stage having first and second differential input terminals, first and second differential output terminals, and means for altering the gain of the input stage, wherein the means for altering the gain of the input stage comprises a pair of variable loads;
 b. a differential output stage having:
  i. a third differential input terminal connected to the first differential output terminal and adapted to receive a first differential input signal;
  ii. a fourth differential input terminal connected to the second differential output terminal and adapted to receive a second differential input signal;
  iii. a third differential output terminal connected to the means for altering the gain of the input stage; and
  iv. a fourth differential output terminal connected to the means for altering the gain of the input stage;
  v. wherein the differential output stage is adapted to compare the first differential input signal with the second differential input signal to produce a first differential output signal on the third differential output terminal and a second differential output signal on the fourth differential output terminal; and c. configurable feedback means for selectively changing the resistance through the variable loads in response to at least one filter control signal.

15. A differential amplifier comprising:

a. a power-supply terminal;

b. a differential input stage having first and second differential input terminals and first and second differential output terminals, the differential input stage including:

i. a first adjustable resistive load, the first adjustable resistive load having:
    1) a first transistor having a first current-handling terminal connected to the power-supply terminal, a second current-handling terminal connected to the first differential output terminal, and a control terminal connected to a voltage reference; and
    2) a second transistor having a first current-handling terminal connected to the power-supply terminal, a second current-handling terminal connected to the first differential output terminal, and a first resistance-control terminal; and ii. a second adjustable resistive load, the second adjustable resistive load having:
    1) a third transistor having a first current-handling terminal connected to the power-supply terminal, a second current-handling terminal connected to the second differential output terminal, and a control terminal connected to the voltage reference; and
    2) a fourth transistor having a first current-handling terminal connected to the power-supply terminal, a second current-handling terminal connected to the second differential output terminal, and a second resistance-control terminal; and c. a differential output stage including:

i. a third differential input terminal connected to the first differential output terminal;

ii. a fourth differential input terminal connected to the second differential output terminal;

iii. a third differential output terminal connected to the first resistance-control terminal; and iv. a fourth differential output terminal connected to the second resistance-control terminal.

\* \* \* \* \*